(12) United States Patent
Goller et al.

(10) Patent No.: US 11,373,857 B2
(45) Date of Patent: Jun. 28, 2022

(54) SEMICONDUCTOR SURFACE SMOOTHING AND SEMICONDUCTOR ARRANGEMENT

(71) Applicant: Infineon Technologies AG, Neubiberg (DE)

(72) Inventors: Bernhard Goller, Villach (AT); Iris Moder, Villach (AT); Petra Fischer, Wernberg (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 37 days.

(21) Appl. No.: 16/411,784

(22) Filed: May 14, 2019

(65) Prior Publication Data

US 2020/0365385 A1 Nov. 19, 2020

(51) Int. Cl.
*H01L 21/02* (2006.01)
*H01L 29/16* (2006.01)
*H01L 21/306* (2006.01)
*H01L 21/3063* (2006.01)
*H01L 21/304* (2006.01)
*H01L 21/3065* (2006.01)

(52) U.S. Cl.
CPC ...... *H01L 21/0201* (2013.01); *H01L 21/0203* (2013.01); *H01L 21/304* (2013.01); *H01L 21/3063* (2013.01); *H01L 21/3065* (2013.01); *H01L 21/30604* (2013.01); *H01L 29/1608* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,225,647 B1* | 5/2001 | Kurtz | ............... | H01L 33/346 257/103 |
| 6,273,950 B1* | 8/2001 | Kitabatake | ............... | C30B 33/00 117/95 |
| 2007/0082465 A1* | 4/2007 | Song | ............... | C30B 25/183 438/478 |
| 2009/0117720 A1* | 5/2009 | Bedell | ............... | H01L 21/02203 438/508 |
| 2013/0187532 A1* | 7/2013 | Sharifi | ............... | H01J 9/022 313/310 |
| 2015/0266779 A1* | 9/2015 | Miyairi | ............... | B01D 46/2418 428/116 |
| 2018/0257994 A1* | 9/2018 | Hvam | ............... | B01D 46/2429 |
| 2019/0006529 A1* | 1/2019 | Bolotnikov | ............... | H01L 29/0623 |
| 2019/0304929 A1* | 10/2019 | Yang | ............... | H01L 23/5226 |

\* cited by examiner

*Primary Examiner* — Moin M Rahman
(74) *Attorney, Agent, or Firm* — Cooper Legal Group LLC (57) ABSTRACT

One or more semiconductor manufacturing methods and/or semiconductor arrangements are provided. In an embodiment, a silicon carbide (SiC) layer is provided. The SiC layer has a first portion overlying a second portion. The first portion has a first side distal the second portion and a second side proximal the second portion. The first portion is converted into a porous layer overlying the second portion. The porous layer has a first side distal the second portion and a second side proximal the second portion. The porous layer is removed to expose a first side of the second portion. After removing the porous layer, the first side of the second portion has a surface roughness less than a surface roughness of the first side of the first portion and/or less than a surface roughness of the first side of the porous layer.

18 Claims, 8 Drawing Sheets

SEMICONDUCTOR SURFACE SMOOTHING AND SEMICONDUCTOR ARRANGEMENT

TECHNICAL FIELD

The present disclosure generally relates to semiconductor processing and particularly to silicon carbide (SiC) processing.

BACKGROUND

Semiconductor devices formed with silicon carbide (SiC) have a number of advantages over other semiconductor devices (e.g., silicon semiconductor devices) such as a higher breakdown electric field strength, a comparably wide band gap, etc., which may facilitate high voltage and/or high current switching capabilities. However, compared with some other semiconductor devices, SiC semiconductor devices may have higher manufacturing costs, lower production yield, and/or higher substrate cost.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, a method is provided. A silicon carbide (SiC) layer may be provided. The SiC layer may have a first portion overlying a second portion. The first portion has a first side distal the second portion and a second side proximal the second portion. The second portion has a first side proximal the first portion and a second side distal the first portion. The first portion may be converted into a porous layer overlying the second portion of the SiC layer. The porous layer has a first side distal the second portion and a second side proximal the second portion. The first side of the second portion is proximal the porous layer and the second side of the second portion is distal the porous layer. The porous layer may be removed to expose the first side of the second portion. After removing the porous layer, the first side of the second portion may have a surface roughness less than a surface roughness of the first side of the first portion and/or less than a surface roughness of the first side of the porous layer.

In an embodiment, a semiconductor arrangement is provided. The semiconductor arrangement may comprise a SiC layer. The semiconductor arrangement may comprise a porous layer overlying the SiC layer. The porous layer may comprise SiC. The porous layer has a first side distal the SiC layer and a second side proximal the SiC layer. The SiC layer has a first side proximal the porous layer and a second side distal the porous layer. The semiconductor arrangement may comprise a semiconductor device disposed at the second side of the SiC layer.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

The term "over" and/or "overlying" is not to be construed as meaning only "directly over" and/or "having direct contact with". Rather, if one element is "over" and/or "overlying" another element (e.g., a layer is overlying another layer or a layer is deposited over another layer), a further element (e.g., a further layer) may be positioned between the two elements (e.g., a further layer may be positioned between a first layer and a second layer if the first layer is "over" and/or "overlying" the second layer).

The semiconductor substrate or body may extend along a main extension plane. The term "horizontal" as used in this specification intends to describe an orientation substantially parallel to said main extension plane. A first or main horizontal side of the semiconductor substrate or body may run substantially parallel to horizontal directions or may have surface sections that enclose an angle of at most 8° (or at most 6°) with the main extension plane. The first or main horizontal side can be for instance the surface of a wafer or a die. Sometimes, the horizontal direction is also referred to as lateral direction.

The term "vertical" as used in this specification intends to describe an orientation which is substantially arranged perpendicular to the horizontal direction, (e.g., parallel to the normal direction of the first side of the semiconductor substrate or body or parallel to the normal direction of a surface section of the first side of the semiconductor substrate or body).

Semiconductor material may be processed to manufacture semiconductor devices, such as two-terminal devices (e.g., diodes), three-terminal devices (e.g., field-effect transistors (FETs), metal-oxide field effect transistors (MOSFETs), insulated gate bipolar transistors (IGBTs), junction field effect transistors (JFETs) and/or thyristors), and/or semiconductor devices having more than three terminals.

For example, a wide band-gap semiconductor material (e.g., a semiconductor material with a band-gap greater than 2 eV), such as silicon carbide (SiC) and/or gallium nitride (GaN) may be used for manufacturing semiconductor devices. The wide band-gap semiconductor material may have a high breakdown field strength (e.g., greater than 2.5 MV/cm) and/or a high critical avalanche field strength. Accordingly, when using the wide band-gap semiconductor material, doping of semiconductor regions may be higher compared with lower band-gap semiconductor materials, which may reduce an on-resistance (RON). Examples presented herein are mainly explained with regard to SiC as a wide band-gap semiconductor material, but one or more techniques presented herein may be applied to other types of wide band-gap semiconductor materials, such as other wide band-gap semiconductor materials that allow for porosification and/or where chemical and/or electrochemical etching (e.g., electrochemical polishing) is not possible and/or is not efficient to achieve a smoother surface.

Figure 7:
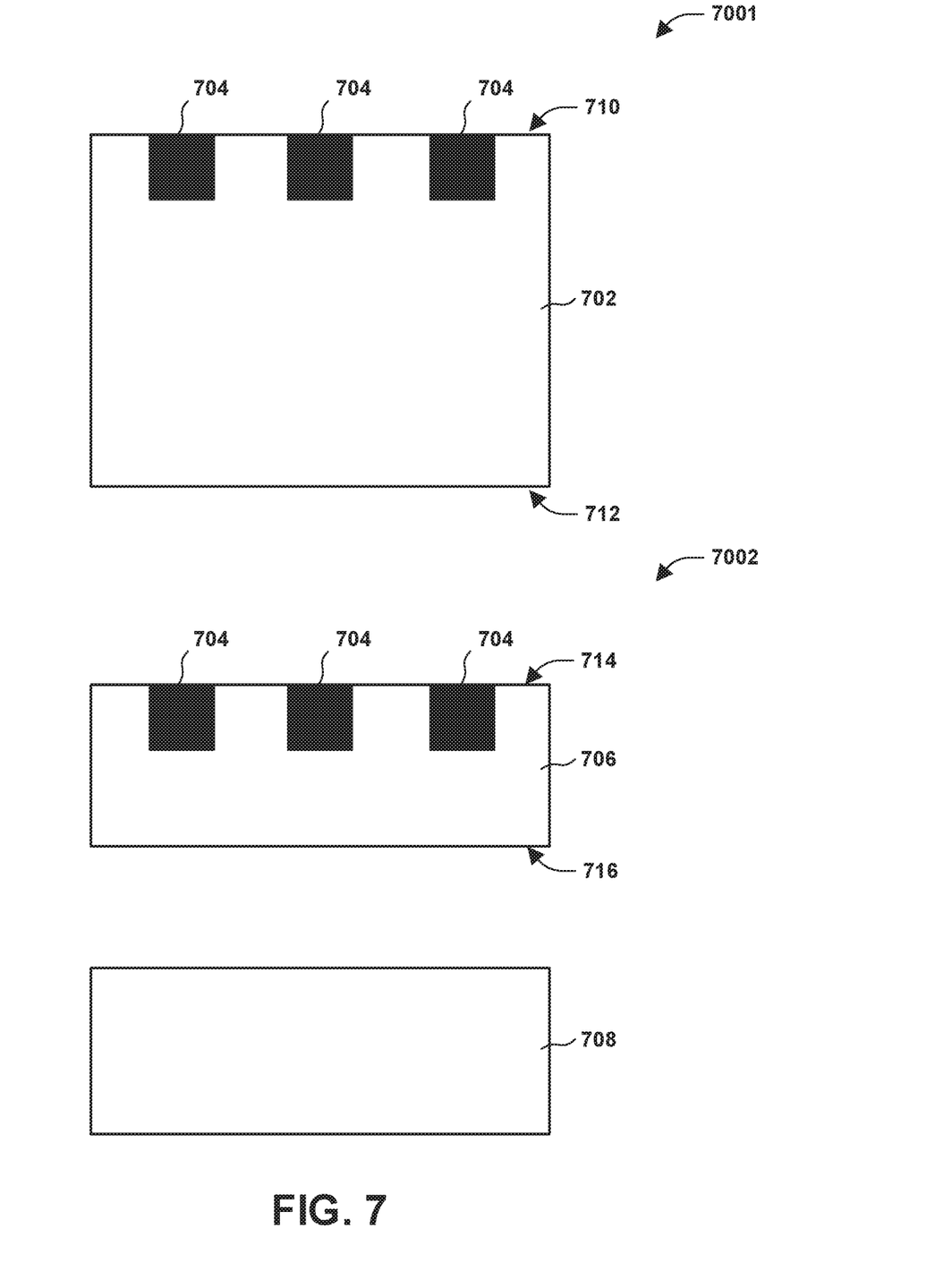
FIG. 7 schematically illustrates actions of splitting a SiC wafer according to various examples.

A SiC layer (e.g., bulk SiC, ground SiC, and/or a SiC layer of a split SiC wafer) may be provided. One or more devices (e.g., one or more semiconductor devices) may be disposed within the SiC layer and/or at a side of the SiC layer. In some examples, a first side of the SiC layer (e.g., a surface of the SiC layer corresponding to the first side) may be smoothed (e.g., planarized) for (further) processing of the SiC layer. The first side of the SiC layer may be rough as a result of splitting a SiC wafer to obtain the SiC layer (as illustrated in FIG. 7), for example. The first side may be smoothed in order to apply one or more processes to the SiC layer, such as metallization and/or deposition of an epitaxial layer onto the SiC layer (and/or onto the first side of the SiC layer). For example, the one or more processes may be applied for forming a semiconductor device.

In some examples, in order to smooth the first side of the SiC layer for subsequent processing and/or in order to reduce a thickness of the SiC layer to a desired thickness, grinding (e.g., grinding using a grinding wheel) of the SiC layer may be performed to remove portions of SiC of the SiC layer. However, due to a high hardness and/or a toughness (e.g., a low fracture toughness) of SiC, grinding the SiC layer is a slow (e.g., 10 µm/min) and/or an expensive process (e.g., grinding of the SiC layer may be associated with a high consumption of the grinding wheel). Further, grinding the SiC layer may deteriorate a surface quality and/or a subsurface quality of the SiC layer. For example, grinding the SiC layer may introduce crystal damage and/or crystal defects to the SiC layer. Polishing (e.g., chemical-mechanical polishing (CMP) and/or etching (e.g., wet etching and/or plasma etching) may be applied to the SiC layer to increase the surface quality and/or the subsurface quality of the SiC layer (e.g., the surface quality and/or the subsurface quality may be increased via polishing and/or etching in order to deposit the epitaxial layer onto the SiC layer and/or in order to perform metallization).

In some examples, the SiC layer may be made of a 4H-SiC polytype (e.g., a crystalline structure of SiC) having a hardness and/or a toughness higher than silicon and/or higher than other SiC polytypes, amorphous SiC and/or polycrystalline SiC. Thus, smoothing the first side of the SiC layer and/or reducing the thickness of the SiC layer to the desired thickness may take an extended period of time and/or may be expensive. Alternatively and/or additionally, the SiC layer may be made of a SiC polytype different than the 4H-SiC polytype (e.g., a 2H-SiC polytype and/or a 6H-SiC polytype). Hereinafter "made of" is to be interpreted within typical manufacturing tolerances, i.e., the SiC layer may comprise impurities caused by manufacturing and/or dopants from a different material.

In accordance with one or more of the techniques presented herein, in order to provide a smoothed surface of the SiC layer and/or in order to reduce a thickness of the SiC layer, a first portion of the SiC layer corresponding to the first side of the SiC layer may be converted into a porous layer comprising SiC. The porous layer may be removed to expose a smoothed surface of the SiC layer. For example, the smoothed surface may have a surface roughness that is less than a surface roughness of the first side of the SiC layer. Converting the first portion of the SiC layer to the porous layer and/or removing the porous layer may require fewer resources, may cost less and/or may be faster than grinding the SiC layer (without converting the first portion of the SiC layer to the porous layer) at the first side in order to smoothen the first side and/or in order to reduce the thickness of the SiC layer, which may be especially advantageous in embodiments where the SiC layer is made of the 4H-SiC polytype (having a hardness and/or a toughness higher than other SiC polytypes) and/or a different SiC polytype having a high hardness and/or a high toughness.

An embodiment of the presently disclosed embodiments comprises a method. The method may be performed for surface smoothing in semiconductor manufacturing. Alternatively and/or additionally, the method may be performed for reducing a thickness of a semiconductor layer. The method comprises providing a SiC layer having a first portion overlying a second portion. The first portion has a first side distal the second portion and a second side proximal the second portion. The first side of the first portion is opposite the second side of the first portion. The second portion has a first side proximal the first portion and a second side distal the first portion. The first side of the second portion is opposite the second side of the second portion.

The SiC layer may be made of SiC. For example, the SiC layer may comprise SiC. Alternatively and/or additionally, the SiC layer may comprise SiC in crystalline form. The SiC layer may comprise a single SiC polytype (e.g., one of the 4H-SiC polytype, the 2H-SiC polytype, and/or the 6H-SiC polytype). Alternatively and/or additionally, the SiC layer may comprise multiple SiC polytypes. Alternatively and/or additionally, the SiC layer may comprise impurities and/or dopants within levels associated with fabrication tolerances.

In some examples, the first portion of the SiC layer may be in direct contact with the second portion of the SiC layer. Alternatively and/or additionally, the first portion of the SiC layer may not be in direct contact with the second portion of the SiC layer. For example, a further portion of the SiC layer may be located between the first and the second portion of the SiC layer.

The first portion of the SiC layer is converted into a porous layer overlying the second portion of the SiC layer. The porous layer has a first side distal the second portion and a second side proximal the second portion. The first side of the second portion is proximal the porous layer and the second side of the second portion is distal the porous layer. The first side of the porous layer is opposite the second side of the porous layer.

According to some embodiments, the first portion of the SiC layer may be converted to the porous layer by electrochemically porosifying the first portion of the SiC layer. The first portion of the SiC layer may be electrochemically porosified by electrochemically etching the first portion, which may induce anodic dissolution of semiconductor material of the first portion. An etch rate of the electrochemical etching may be influenced by additives in etching chemicals used to perform the electrochemical etching. In some examples, merely a portion of the first portion of the SiC layer may be porosified and/or converted into the porous layer. Alternatively and/or additionally, (the entirety of) the first portion of the SiC layer may be porosified and/or converted into the porous layer.

According to some embodiments, the porous layer has a porosity (e.g., a pore density) greater than a porosity of the second portion of the SiC layer. The pore density may be a ratio between gas (e.g., air) in the SiC material and the SiC material surrounding the gas. For example, the gas may be at least partly located in gas-filled voids and/or in ramifications within the SiC material.

The porous layer is removed to expose the first side of the second portion. After removing the porous layer, the first side of the second portion has a surface roughness less than a surface roughness of the first side of the first portion and/or a surface roughness of the first side of the porous layer.

According to some embodiments, before converting the first portion, a semiconductor device is disposed at the second side of the second portion. After removing the porous layer, the semiconductor is disposed at the second side of the second portion.

According to some embodiments, the porous layer may be removed by electrochemically etching the porous layer. Process parameters used for electrochemically etching the porous layer may be configured and/or one or more etching chemicals (e.g., additives in an electrochemical solution) may be used such that the porous layer becomes unstable and/or is removed (e.g., portions of the porous layer may become unstable and/or may peel off). The porous layer may be removed via electrochemically etching the porous layer while porosifying the first portion of the SiC layer to form the porous layer.

According to some embodiments, the porous layer may be removed by plasma etching the porous layer. For example, the porous layer may be plasma etched using a plasma etcher.

According to some embodiments, the porous layer may be removed by oxidizing the porous layer to form an oxidized porous layer and/or by etching the oxidized porous layer. The oxidized porous layer may be formed by thermally oxidizing the porous layer at a thermal oxidation temperature. The oxidized porous layer may be etched (e.g., electrochemically etched, plasma etched and/or wet etched) to remove the oxidized porous layer (from the SiC layer).

According to some embodiments, etching the oxidized porous layer forms a residual porous layer. The residual porous layer may comprise one or more remaining portions of SiC. The residual porous layer may be oxidized to form an oxidized residual porous layer. The oxidized residual porous layer may be etched.

According to some embodiments, the porous layer may be removed by grinding the porous layer. For example, the porous layer may be grinded using a grinding wheel (e.g., a fine grinding wheel and/or a coarse grinding wheel).

According to some embodiments, the porous layer may be removed by performing a damage implant to the porous layer to form an implanted porous layer and/or etching the implanted porous layer. For example, an implantation process may be applied to the porous layer to perform the damage implant and/or to form the implanted porous layer. The implanted porous layer may be etched (e.g., electrochemically etched, plasma etched and/or wet etched) to remove the implanted porous layer.

According to some embodiments, the porous layer may be removed by depositing a metal layer over the porous layer. The metal layer and/or the porous layer may be thermally treated to form a metal silicide. The metal silicide may be etched.

According to some embodiments, the porous layer may be removed by etching the porous layer using potassium hydroxide (KOH) and/or sodium hydroxide (NaOH). For example, KOH and/or NaOH may be heated at a melting temperature to form a melted KOH and/or a melted NaOH, respectively. The porous layer may be etched using the melted KOH and/or the melted NaOH to remove the porous layer.

Some embodiments of methods provided herein for reducing a surface roughness may comprise repeating the method steps and/or combining different methods in order to achieve a higher reduction of the surface roughness. For example, after removing the porous layer, a further porosification step may be applied, which may result in a further porous layer that can be removed. In addition or as an alternative, after removing the porous layer, a metal layer may be deposited over the remaining SiC layer, which metal layer may be subsequently treated to form a metal silicide. The metal silicide and/or the porous layer may then be removed.

An embodiment of the presently disclosed embodiments comprises a semiconductor arrangement. The semiconductor arrangement comprises a SiC layer and a porous layer overlying the SiC layer. The porous layer comprises SiC. The porous layer has a first side distal the SiC layer and a second side proximal the SiC layer. The SiC layer has a first side proximal the porous layer and a second side distal the porous layer. The semiconductor arrangement comprises a semiconductor device disposed at the second side of the SiC layer.

According to some embodiments, the porous layer has a porosity greater than a porosity of the SiC layer.

Figure 1:
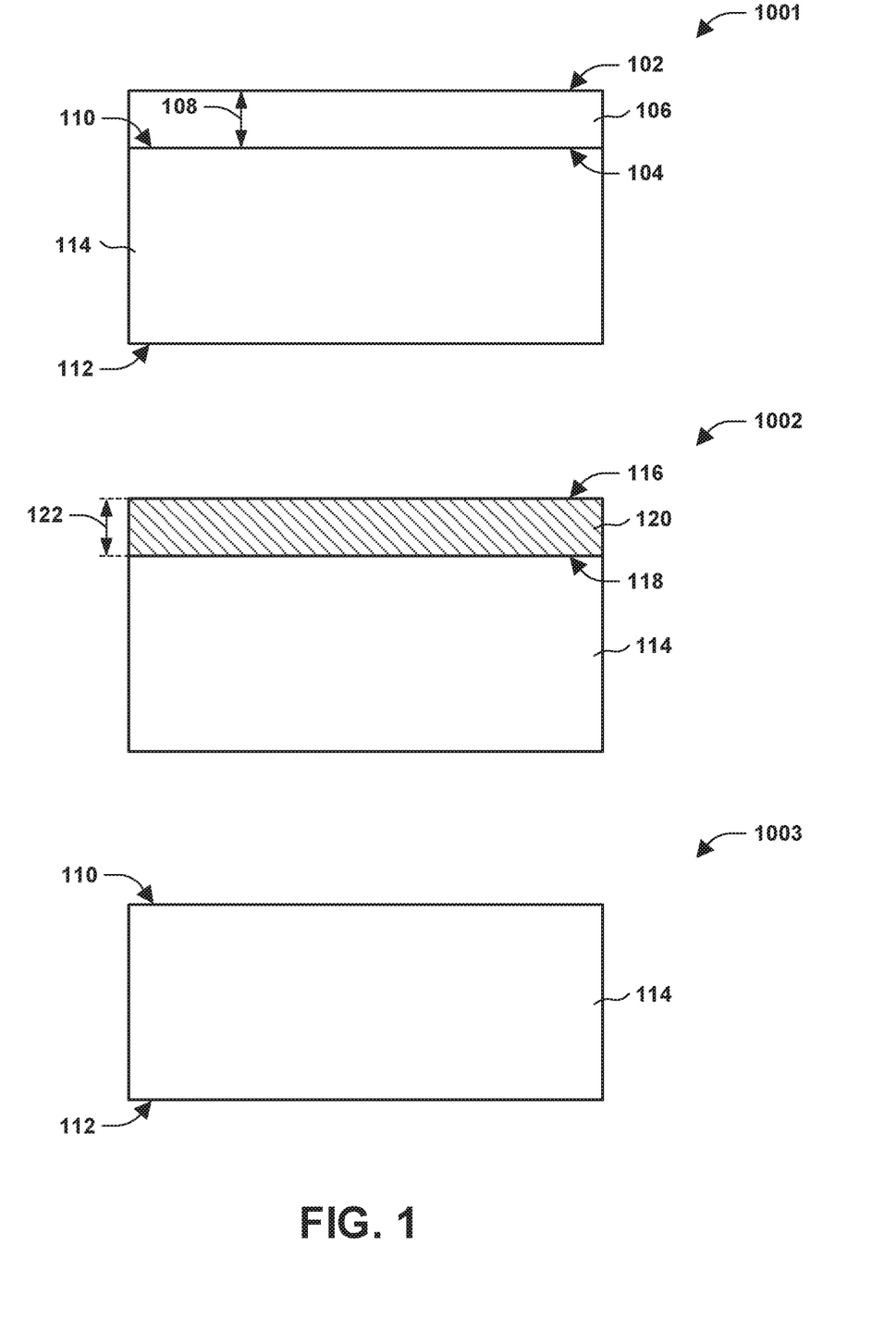
FIG. 1 schematically illustrates actions of processing SiC according to various examples.

FIG. 1 illustrates aspects with respect to processing SiC according to various examples of the present disclosure. At 1001, a SiC layer is provided. The SiC layer has a first portion 106 overlying a second portion 114. The first portion 106 has a first side 102 distal the second portion 114 and/or a second side 104 proximal the second portion 114. Alternatively and/or additionally, the second portion 114 has a first side 110 proximal the first portion 106 and/or a second side 112 distal the first portion 106.

In some examples, the first side 102 of the first portion 106 of the SiC layer may be opposite the second side 104 of the first portion 106 of the SiC layer. Alternatively and/or additionally, the first side 110 of the second portion 114 of the SiC layer may be opposite the second side 112 of the second portion 114 of the SiC layer.

In some examples, the SiC layer (e.g., the first portion 106 and/or the second portion 114) is made of SiC. For example, the SiC layer may comprise SiC. Alternatively and/or additionally, the SiC layer may comprise SiC in crystalline form. The SiC layer may comprise a single SiC polytype (e.g., one of the 4H-SiC polytype, the 2H-SiC polytype, and/or the 6H-SiC polytype). Alternatively and/or additionally, the SiC layer may comprise multiple SiC polytypes. Alternatively and/or additionally, the SiC layer may comprise impurities and/or dopants within levels associated with fabrication tolerances.

In some examples, the first portion 106 of the SiC layer is vertically coincident with the second portion 114 of the SiC layer, such that a vertical line intersects the first portion 106 and the second portion 114. In some examples, the first portion 106 of the SiC layer may (completely) cover the first side 110 of the second portion 114 of the SiC layer. Alternatively and/or additionally, one or more regions (and/or one or more portions) of the second portion 114 at the first side 110 of the second portion 114 may not be covered by the first portion 106 of the SiC layer (e.g., may be free of the first portion 106). In some examples, the first portion 106 of the SiC layer may be a first layer (e.g., a first sublayer) of the SiC layer vertically coincident with a second layer (e.g., a second sublayer) comprising the second portion 114. Alternatively and/or additionally, the first portion 106 may be adjacent to the first side 110 of the second portion 114 of the SiC layer.

In some examples, the SiC layer may consist of a single piece of SiC in crystalline form. For example, the first portion 106 of the SiC layer may be a portion (and/or a region and/or a layer) of the single piece of SiC and/or the second portion 114 may be a different portion (and/or a different region and/or a different layer) of the single piece of SiC. The single piece of SiC may be continuous, such that the first portion 106 and the second portion 114 may not be separated by a physical interface, for example.

Alternatively and/or additionally, the SiC layer may consist of multiple pieces of SiC in crystalline form. For example, the first portion 106 of the SiC layer may comprise one or more first pieces of the multiple pieces of SiC in crystalline form. Alternatively and/or additionally, the second portion 114 of the SiC layer may comprise one or more second pieces of the multiple pieces of SiC in crystalline form. In some examples, the multiple pieces of SiC in crystalline may be separate from each other (e.g., a piece of the multiple pieces of SiC in crystalline form may be separate from a different piece of the multiple pieces of SiC in crystalline form).

In some examples, the first portion 106 of the SiC layer and the second portion 114 of the SiC layer may both comprise one or more pieces of the multiple pieces of SiC in crystalline form. For example, the first portion 106 may comprise a portion (e.g., a region) of the one or more pieces and/or the second portion 114 may comprise a different portion (e.g., a different region) of the one or more pieces. Alternatively and/or additionally, the first portion 106 of the SiC layer may not comprise a portion of a piece comprised within the second portion 114 of the SiC layer. Alternatively and/or additionally, the second portion 114 of the SiC layer may not comprise a portion of a piece comprised within the first portion 106 of the SiC layer.

In some examples, the multiple pieces of SiC in crystalline form may comprise varying SiC polytypes. For example, a first piece of the multiple pieces of SiC in crystalline form may comprise a first SiC polytype, a second piece of the multiple pieces of SiC in crystalline form may comprise a second SiC polytype, etc. Alternatively and/or additionally, the one or more first pieces of the first portion 106 may comprise the first SiC polytype and/or the one or more second pieces of the second portion 114 may comprise the second SiC polytype.

Alternatively and/or additionally, the multiple pieces of SiC in crystalline form may comprise a single SiC polytype. For example, the one or more first pieces of the first portion 106 and the one or more second pieces of the second portion 114 may comprise the single SiC polytype.

In some examples, the first portion 106 of the SiC layer may be in direct contact with the second portion 114 of the SiC layer. For example, one or more regions (and/or one or more portions) of the first portion 106 of the SiC layer may be in direct contact with one or more regions of the second portion 114 of the SiC layer. For example, the second side 104 of the first portion 106 may be in direct contact with the first side 110 of the second portion 114.

Alternatively and/or additionally, the first portion 106 of the SiC layer may not be in direct contact with the second portion 114 of the SiC layer. For example, the SiC layer may comprise a third layer (e.g., a third sublayer) between the first portion 106 of the SiC layer and the second portion 114 of the SiC layer. The third layer may comprise a third SiC polytype different than a SiC polytype of the first portion 106 (e.g., the third SiC polytype may be different than the single SiC polytype and/or different than the first SiC polytype) and/or different than a SiC polytype of the second portion 114 (e.g., the third SiC polytype may be different than the single SiC polytype and/or different than the second SiC polytype). Alternatively and/or additionally, the third layer may comprise the first SiC polytype of the first portion 106 and/or the second SiC polytype of the second portion 114. Alternatively and/or additionally, the third layer may comprise the single SiC polytype of the SiC layer.

A thickness 108 of the first portion 106 of the SiC layer (along a vertical direction) may be in the range of at least 1 µm to at most 100 µm and/or in the range of at least 5 µm to at most 25 µm. The thickness 108 of the first portion 106 may correspond to a thickness 122 of a porous layer 120. Alternatively and/or additionally, a thickness of the second portion 114 of the SiC layer (along the vertical direction) may be in the range of at least 10 µm to at most 600 µm and/or in the range of at least 10 µm to at most 200 µm.

In some examples, the first side 102 of the first portion 106 of the SiC layer may have a first surface roughness. The first surface roughness may be greater than a threshold surface roughness for performing one or more processes to the SiC layer, such as metallization and/or deposition of an epitaxial layer onto the SiC layer (and/or onto the first side 102 of the first portion 106 of the SiC layer). For example, smoothing of the SiC layer may be required for performing the one or more processes as a result of the first surface roughness of the first side 102 of the first portion 106 being greater than the threshold surface roughness.

At 1002, the first portion 106 of the SiC layer is converted (e.g., transformed) into the porous layer 120 overlying the second portion 114 of the SiC layer. The porous layer 120 has a first side 116 distal the second portion 114 and/or a second side 118 proximal the second portion 114. Alternatively and/or additionally, the first side 110 of the second portion 114 is proximal porous layer 120 and/or the second side 112 of the second portion 114 is distal the porous layer 120. In some examples, the first side 116 of the porous layer 120 is opposite the second side 118 of the porous layer 120.

The first portion 106 of the SiC layer may be converted into the porous layer 120 by electrochemically porosifying the first portion 106 of the SiC layer to form the porous layer 120. For example, the first portion 106 of the SiC layer may be electrochemically porosified via photoelectrochemical etching. Alternatively and/or additionally, the first portion 106 of the SiC layer may be electrochemically porosified by electrochemically etching the first portion 106, which may induce anodic dissolution of semiconductor material of the first portion 106. An etch rate of the electrochemical etching may be influenced by additives in etching chemicals used to perform the electrochemical etching. The first portion 106 may be dipped into and/or rinsed with an electrolyte containing fluorine (e.g., hydrofluoric acid (HF) and/or ethanol). Alternatively and/or additionally, the electrolyte may comprise an aqueous HF solution. Anodic dissolution locally excavates groups of lattice atoms from the crystal lattice of the first portion 106 of the SiC layer where pores form within the first portion 106 of the SiC layer. Residual non-dissolved lattice atoms form a crystalline lattice skeleton. Anodic porosification of at least a portion of the first portion 106 of the SiC layer may be driven via ultraviolet (UV) illumination.

In some examples, merely a portion of the first portion 106 of the SiC layer may be porosified and/or converted into the porous layer 120. Alternatively and/or additionally, (the entirety of) the first portion 106 of the SiC layer may be porosified and/or converted into the porous layer 120. In some examples, a portion of the second portion 114 of the SiC layer may be porosified and/or converted into the porous layer 120. Alternatively and/or additionally, a portion of the second portion 114 of the SiC layer may not be porosified and/or may not be converted into the porous layer 120.

In some examples, a first porosity (e.g., an overall porosity, also referred to as a pore density) of the porous layer 120 may be greater than a second porosity of the first portion 106 of the SiC layer (prior to converting the first portion 106 of the SiC layer to the porous layer 120. The first porosity may be a measure of empty spaces (e.g., empty spaces of pores) in the porous layer 120. Typically, porosity is defined as the fraction of the volume of empty material over the total volume and can hence vary in between 0% and 100%. Alternatively and/or additionally, the first porosity of the porous layer 120 may be greater than a third porosity of the second portion 114 of the SiC layer (prior to and/or after converting the first portion 106 of the SiC layer to the porous layer 120). The first porosity of the porous layer 120 may be in the range of at least 5% to at most 60% and/or in the range of at least 20% to at most 50%.

In some examples, the thickness 122 of the porous layer 120 (along the vertical direction) may be in the range of at least 1 µm to at most 100 µm and/or in the range of at least 5 µm to at most 25 µm. Alternatively and/or additionally, the thickness 122 of the porous layer 120 may be approximately equal to the thickness 108 of the first portion 106 of the SiC layer. For example, converting the first portion 106 of the SiC layer to the porous layer 120 may not cause a change in thickness of the first portion 106 of the SiC layer and/or the porous layer 120. Alternatively and/or additionally, the thickness 122 of the porous layer 120 may not be approximately equal to the thickness 108 of the first portion 106 of the SiC layer.

At 1003, the porous layer 120 may be removed. For example, the porous layer 120 may be discarded. By removing the porous layer 120 from the SiC layer, the first side 110 of the second portion 114 may be exposed. Alternatively and/or additionally, after removing the porous layer 120, the first side 110 of the second portion 114 may have a second surface roughness. The second surface roughness may be less than the first surface roughness of the first side 102 of the first portion 106 of the SiC layer (prior to converting the first portion 106 of the SiC layer to the porous layer 120). Alternatively and/or additionally, the second surface roughness may be less than a surface roughness of the first side 116 of the porous layer 120. Alternatively and/or additionally, the second surface roughness may be less than the threshold surface roughness for performing the one or more processes to the SiC layer (e.g., metallization and/or deposition of an epitaxial layer onto the SiC layer (e.g., onto the first side 110 of the second portion 114 of the SiC layer)).

In some examples, converting the first portion 106 of the SiC layer into the porous layer 120 and/or removing the porous layer 120 may remove stress introduced to the SiC layer (as a result of grinding the SiC layer, for example). Alternatively and/or additionally, converting the first portion 106 of the SiC layer into the porous layer 120 and/or removing the porous layer 120 may result in a reduced wafer bow of the SiC layer and/or a higher structural stability of the SiC layer. Alternatively and/or additionally, converting the first portion 106 of the SiC layer into the porous layer 120 and/or removing the porous layer 120 may remove crystal damage of the SiC layer (such as crystal damage within the first portion 106 of the SiC layer prior to converting the first portion 105 of the SiC layer into the porous layer 120). Alternatively and/or additionally, converting the first portion 106 of the SiC layer into the porous layer 120 and/or removing the porous layer 120 may introduce less crystal damage to the SiC layer than other techniques for surface smoothing of the SiC layer and/or for reducing a thickness of the SiC layer (along the vertical direction), such as grinding the first portion 106 of the SiC layer without converting the first portion 106 of the SiC layer into the porous layer 120.

Figure 2:
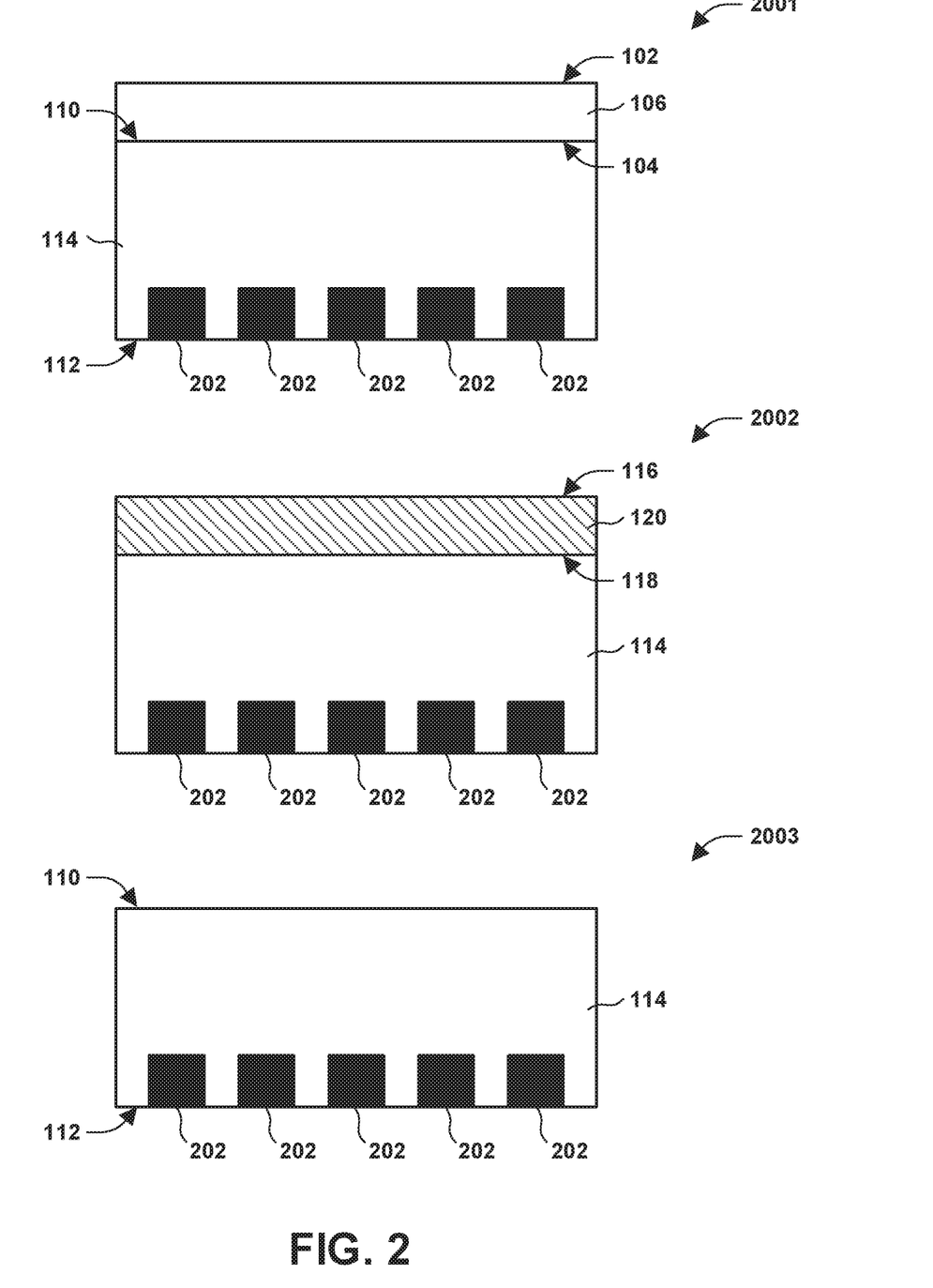
FIG. 2 schematically illustrates actions of processing SiC according to various examples.

FIG. 2 illustrates aspects with respect to processing SiC according to various examples of the present disclosure. The processing of FIG. 2 generally corresponds to the processing of FIG. 1. For example, 2001 of FIG. 2 corresponds to 1001 of FIG. 1. 2002 of FIG. 2 corresponds to 1002 of FIG. 1. 2003 of FIG. 2 corresponds to 1003 of FIG. 1.

A set of semiconductor devices 202 (e.g., a set of one or more semiconductor devices) may be disposed at the second side 112 of the second portion 114 of the SiC layer. In some examples, the set of semiconductor devices 202 may be embedded within the second portion 114 of the SiC layer. Alternatively and/or additionally, one or more portions of a semiconductor device of the set of semiconductor devices 202 may be in direct contact with the second portion 114 of the SiC layer and/or may be covered by the second portion 114 of the SiC layer. Alternatively and/or additionally, one or more portions of a semiconductor device of the set of semiconductor devices 202 may not be in direct contact with the second portion 114 of the SiC layer and/or may not be covered by the second portion 114 of the SiC layer.

In some examples, the set of semiconductor devices 202 may be disposed at the second side 112 of the second portion 114 of the SiC layer at 2001, 2002 and/or 2003. For example, the set of semiconductor devices 202 may be disposed at the second side 112 of the second portion 114 of the SiC layer before converting the first portion 106 of the SiC layer to the porous layer 120. Alternatively and/or additionally, the set of semiconductor devices 202 may be disposed at the second side 112 of the second portion 114 of the SiC layer after removing the porous layer 120 (from the SiC layer).

Figure 3:
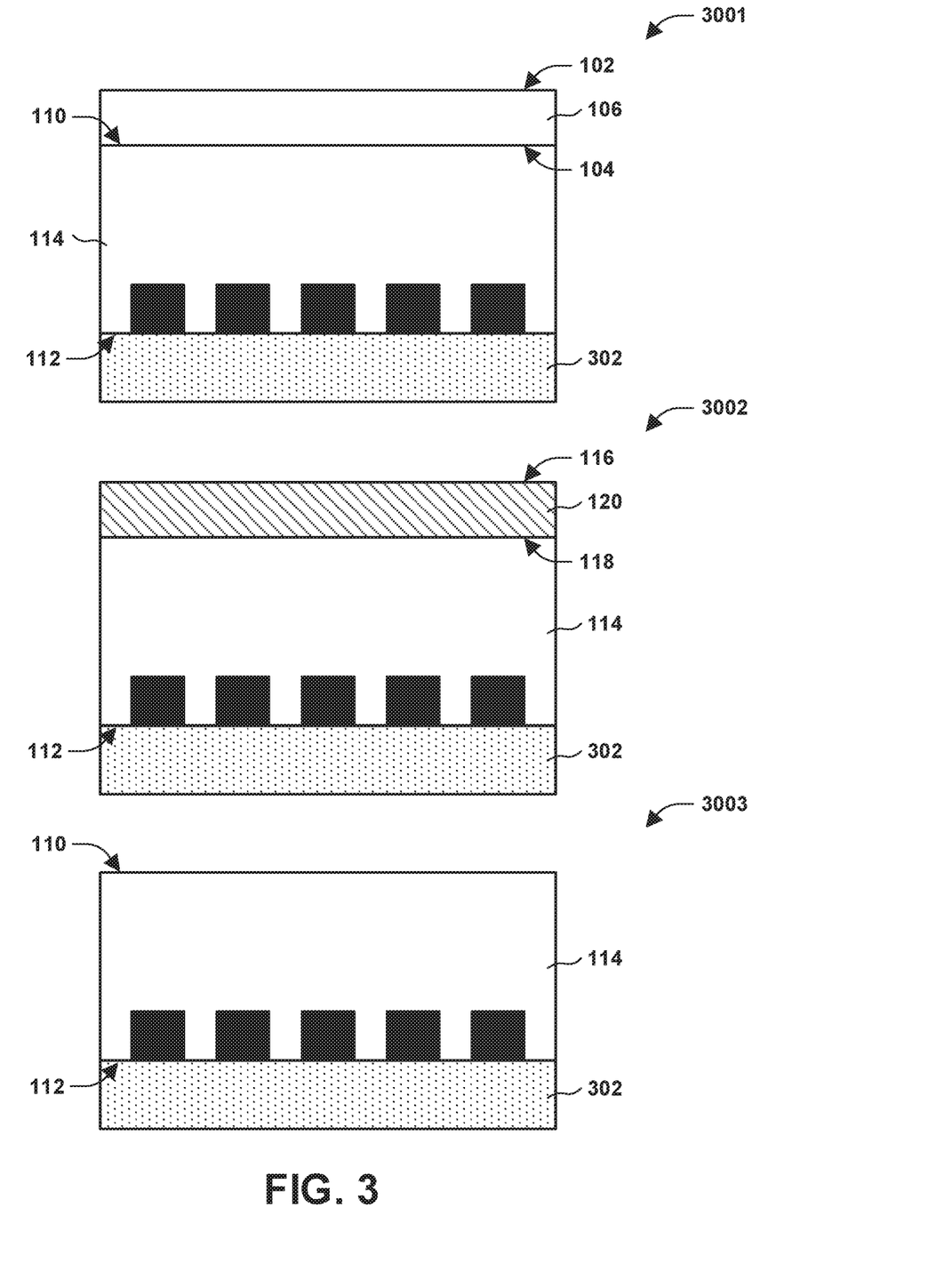
FIG. 3 schematically illustrates actions of processing SiC according to various examples.

FIG. 3 illustrates aspects with respect to processing SiC according to various examples of the present disclosure. The processing of FIG. 3 generally corresponds to the processing of FIG. 1. For example, 3001 of FIG. 3 corresponds to 1001 of FIG. 1. 3002 of FIG. 3 corresponds to 1002 of FIG. 1. 3003 of FIG. 3 corresponds to 1003 of FIG. 1.

A carrier 302 may be attached to the SiC layer. For example, the carrier 302 may be attached to the second side 112 of the second portion 114 of the SiC layer. For example, the carrier 302 may be adjacent to the second side 112 of the second portion 114 of the SiC layer. For example, the SiC layer may be stacked upon the carrier 302. In some examples, the carrier 302 may be in direct contact with one or more portions of a semiconductor device of the set of semiconductor devices 202. Alternatively and/or additionally, the carrier 302 may not be in direct contact with one or more portions of a semiconductor device of the set of semiconductor devices 202.

In some examples, the carrier 302 may be attached to the second side 112 of the second portion 114 of the SiC layer at 3001, 3002, and/or 3003. For example, the carrier 302 may be attached to the second side 112 of the second portion 114 of the SiC layer before converting the first portion 106 of the SiC layer to the porous layer 120. Alternatively and/or additionally, the carrier 302 may be attached to the second side 112 of the second portion 114 of the SiC layer after removing the porous layer 120 (from the SiC layer). In some examples, the SiC layer and/or the set of semiconductor devices 202 may be supported by the carrier 302.

Figure 4:
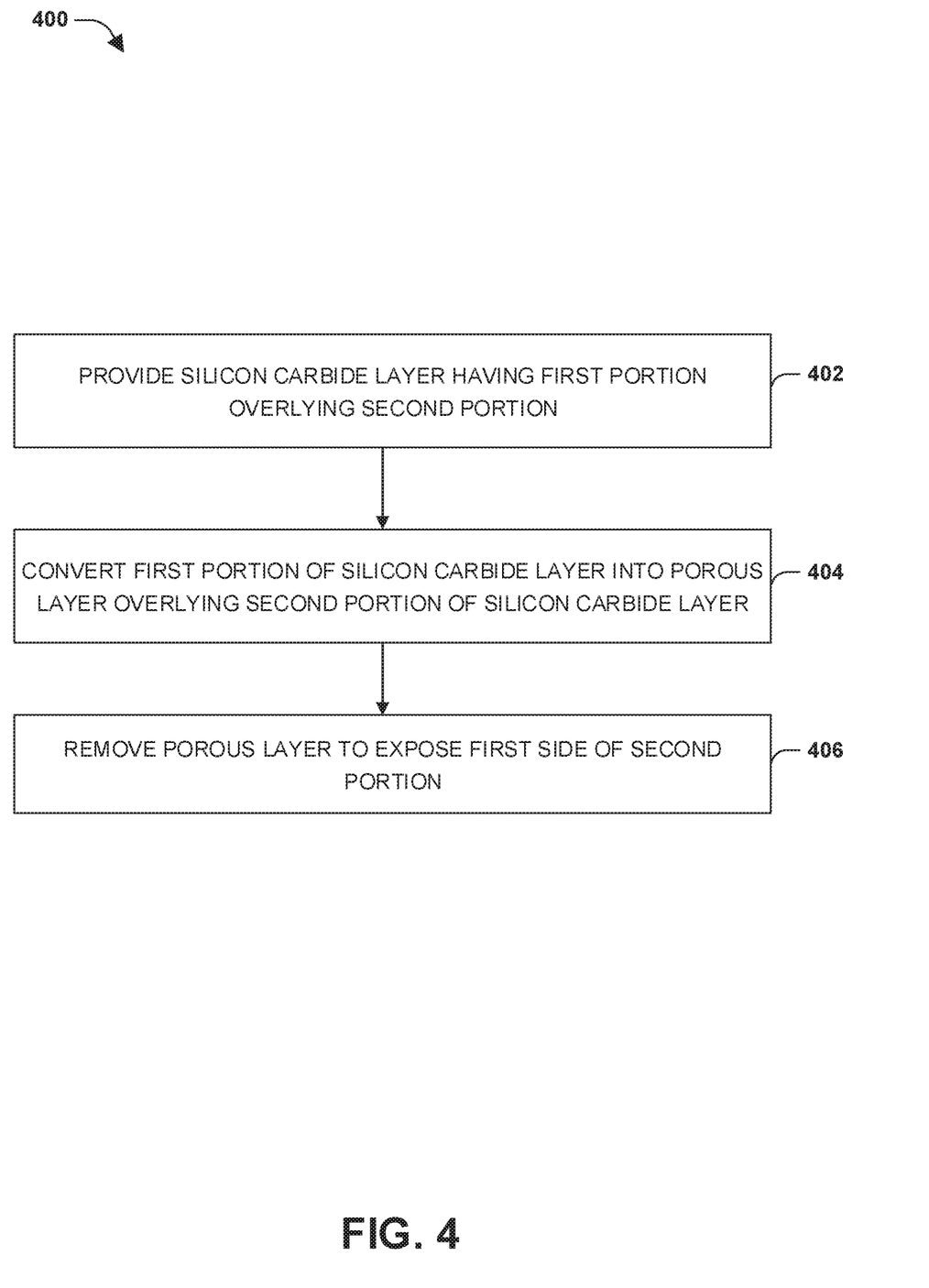
FIG. 4 is an illustration of an example method in accordance with the techniques presented herein.

FIG. 4 is an illustration of an example method 400. The example method 400 corresponds to an example process according to the techniques described herein. At 402, the SiC layer having the first portion 106 overlying the second portion 114 may be provided. At 404, the first portion 106 of the SiC layer may be converted into the porous layer 120 overlying the second portion 114 of the SiC layer. At 406, the porous layer 120 may be removed (from the SiC layer) to expose the first side 110 of the second portion 114 of the SiC layer.

Various techniques may be used, independently and/or separately, for removing the porous layer 120 from the SiC layer.

In a first embodiment, the porous layer 120 may be removed via electrochemically etching the porous layer 120. Process parameters (e.g., current and/or voltage) used for electrochemically etching the porous layer 120 may be configured and/or one or more etching chemicals (e.g., additives in an electrochemical solution) may be applied such that the porous layer 120 becomes unstable and/or is removed (e.g., portions of the porous layer 120 may become unstable and/or may peel off). The porous layer 120 may become unstable and/or may be removed (e.g., portions of the porous layer 120 may gradually peel off) while electrochemically etching the porous layer 120. A high current density and/or a high current (e.g., a total current) may be configured for electrochemically etching the porous layer 120 such that the porous layer 120 becomes unstable and/or is removed (e.g., portions of the porous layer 120 may gradually peel off) while electrochemically etching the porous layer 120 using the high current density and/or the high total current.

In a second embodiment, the porous layer 120 may be removed while porosifying the first portion 106 of the SiC layer to form the porous layer 120 (e.g., in situ removal of the porous layer 120). For example, the first portion 106 of the SiC layer may be electrochemically porosified by electrochemically etching the first portion 106, which may induce anodic dissolution of semiconductor material of the first portion 106. In some examples, the first portion 106 of the SiC may be electrochemically porosified using process parameters (e.g., current and/or voltage) and/or one or more etching chemicals (e.g., additives in an electrochemical solution). The process parameters and/or the one or more etching chemicals may be selected (and/or configured) such that while electrochemically porosifying the first portion 106 of the SiC layer to form the porous layer 120, portions of the porous layer 120 and/or the first portion 106 of the SiC layer become unstable and/or are removed (e.g., the portions may peel off as a result of the SiC being electrochemically porosified using the process parameters and/or the one or more etching chemicals). For example, the first portion 106 of the SiC layer may be electrochemically porosified using a high current and/or a high current density, which may cause the portions to become unstable and/or be removed.

In a third embodiment, the porous layer 120 may be removed via plasma etching (e.g., dry etching) the porous layer 120. For example, the porous layer 120 may be plasma etched using a plasma etcher. It may be appreciated that plasma etching the porous layer 120 may be faster and/or less expensive compared with plasma etching the first portion 106 of the SiC layer (prior to converting the first portion 106 of the SiC layer to the porous layer 120). Alternatively and/or additionally, plasma etching the porous layer 120 may be performed at a higher etch rate than plasma etching the first portion 106 of the SiC layer (prior to converting the first portion 106 of the SiC layer to the porous layer 120). The higher etch rate may be a result of a high aspect ratio of the porous layer 120 and/or a higher surface area of the porous layer 120 as compared with a surface area of the first portion 106 of the SiC layer prior to converting the first portion 106 of the SiC layer to the porous layer 120 (e.g., the higher surface area of the porous layer 120 may correspond to the higher etch rate). The higher surface area of the porous layer 120 is a result of the porous layer 120 having a higher porosity compared with the first portion 106 of the SiC layer (prior to converting the first portion 106 of the SiC layer to the porous layer 120). For example, pores having empty spaces of the porous layer 120 contribute to the higher surface area.

Figure 5:
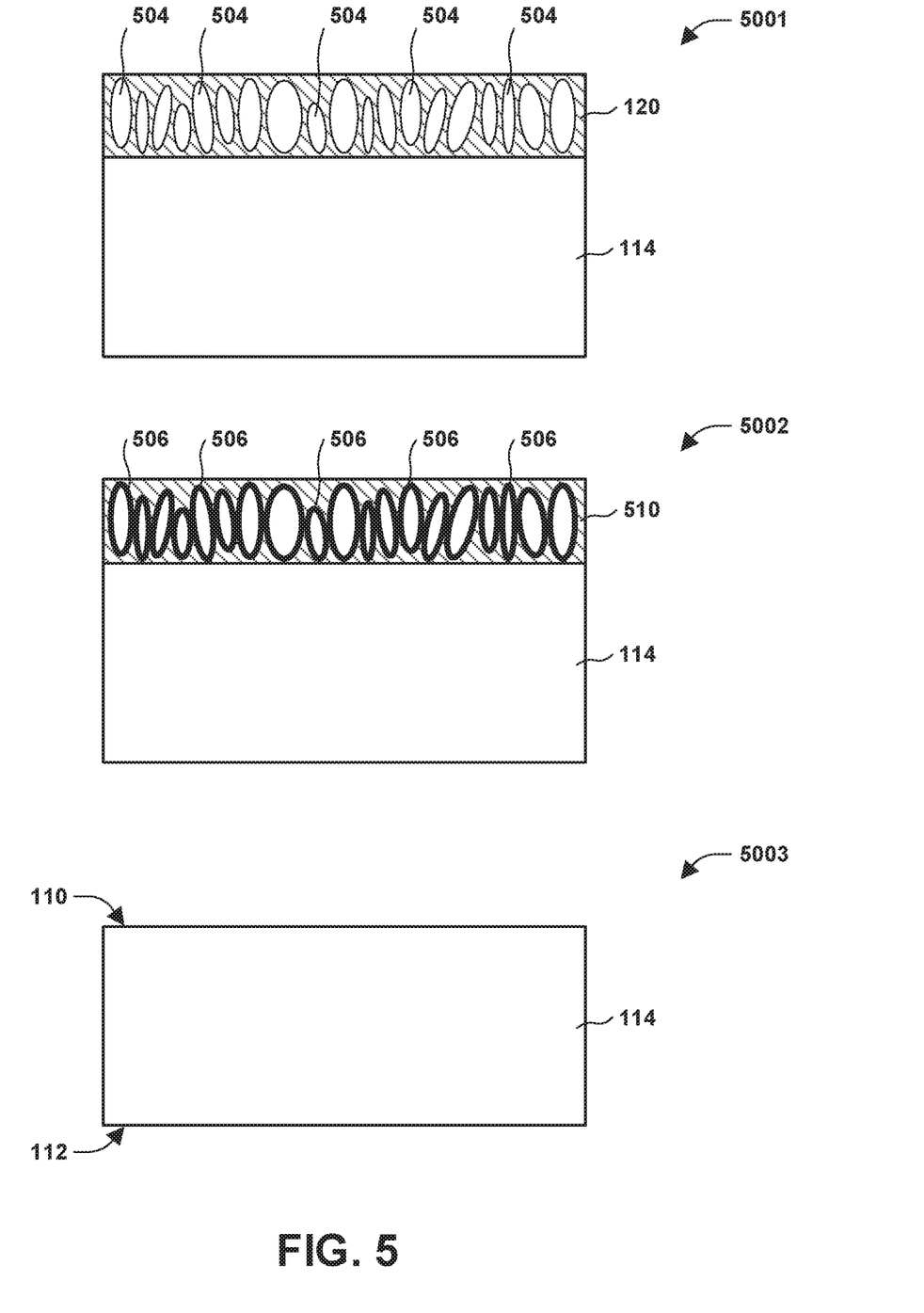
FIG. 5 schematically illustrates actions of removing a porous layer according to a fourth embodiment.

In a fourth embodiment, the porous layer 120 may be removed via oxidizing the porous layer 120. FIG. 5 illustrates aspects with respect to removing the porous layer 120 in accordance with the fourth embodiment. 5001 corresponds to 1002 of FIG. 1.

Pores 504 of the porous layer 120 are shown in FIG. 5. The pores 504 of the porous layer 120 may have an inhomogeneous distribution (of the pores 504) across the porous layer 120. For example, an ensemble of pores of the pores 504 may not exhibit a preferred direction and/or a large-scale order. The pores 504 may (or may not) exhibit a statistical distribution of size, shape and/or orientation. It may be possible that the pores 504 form an interconnected network (of pores). For example, the porous layer 120 may be a sponge-type porous layer.

At 5002, the porous layer 120 may be oxidized. An oxidized porous layer 510 may be formed via oxidizing the porous layer 120 (e.g., the porous layer 120 may be converted and/or transformed into the oxidized porous layer 510). For example, oxidized portions 506 of the oxidized porous layer 510 (shown in black in FIG. 5 bordering the pores 504) of the oxidized porous layer 510 may be formed via oxidizing the porous layer 120. In some examples, the porous layer 120 may be thermally oxidized at a thermal oxidation temperature. In some examples, the thermal oxidation temperature may be in the range of at least 800° C. to at most 1500° C. and/or in the range of at least 1000° C. to at most 1400° C.

In some examples, oxidizing the porous layer 120 may form a higher amount of oxidized portions than oxidizing the first portion 106 of the SiC layer (prior to converting the first portion 106 of the SiC layer to the porous layer 120). The higher amount of oxidized portions may be a result of the high aspect ratio of the porous layer 120 and/or the higher surface area of the porous layer 120 as compared with the first portion 106 of the SiC layer prior to converting the first portion 106 of the SiC layer to the porous layer 120. Regions of the porous layer 120 that surround (and/or are adjacent to) surfaces of the pores 504 may be oxidized to form the oxidized portions 506 surrounding the pores 504. Alternatively and/or additionally, regions of the porous layer 120 that surround and/or are adjacent to other surfaces (such as a surface of the porous layer 120) of the porous layer 120 may be oxidized to form the oxidized portions 506.

At 5003, the oxidized porous layer 510 may be etched (to remove the oxidized porous layer 510). For example, the oxidized porous layer 510 may be electrochemically etched, plasma etched and/or wet etched to remove the oxidized porous layer 510 from the SiC layer. In some examples, the oxidized porous layer 510 may be etched using HF. By etching the oxidized porous layer 510 using HF, the HF may interact with the oxidized portions 506 to convert at least a portion of the oxidized portions 506 into one or more products (e.g., $SiF_4$ and/or $H_2O$). The one or more products may be removed and/or discarded.

In some examples, etching the oxidized porous layer 510 may form a residual porous layer. The residual porous layer may comprise one or more remaining portions of SiC. The one or more remaining portions of SiC may not comprise the oxidized portions 506 (e.g., the oxidized portions 506 may be removed via etching the oxidized porous layer 510). The residual porous layer and/or the one or more remaining portions of SiC may form as a result of large distances between surfaces of the pores 504. A large distance of the large distances may correspond to a distance, that exceeds an oxidation threshold distance, between a first surface of a first pore of the pores 504 and a second surface of a second pore of the pores 504. A portion of SiC between the first surface of the first pore and the second surface of the second pore may not be oxidized while oxidizing the porous layer 120 as a result of the distance between the first surface of the first pore and the second surface of the second pore exceeding the oxidation threshold distance. Accordingly, the residual porous layer and/or the one or more remaining portions of SiC (comprising the portion of SiC between the first surface of the first pore and the second surface of the second pore) may not be oxidized. Due to the residual porous layer and/or the one or more remaining portions of SiC not being oxidized, etching the oxidized porous layer 510 may not remove the one or more remaining portions of SiC (e.g., etching the oxidized porous layer 510 may remove oxidized portions of the oxidized porous layer 510). Thus, etching the oxidized porous layer 510 may form the residual porous layer (comprising the one or more remaining portions of SiC) as a result of the one or more remaining portions of SiC not being oxidized.

In some examples, the residual porous layer may be removed via grinding the residual porous layer (e.g., grinding the one or more remaining portions of SiC), and/or etching the residual porous layer (e.g., electrochemically etching the one or more remaining portions of SiC, plasma etching the one or more remaining portions of SiC, and/or wet etching the one or more remaining portions of SiC). Alternatively and/or additionally, the residual porous layer may be oxidized (rather than grinding the residual porous layer and/or etching the residual porous layer) to form an oxidized residual porous layer comprising one or more portions of oxidized SiC. Alternatively and/or additionally, the oxidized residual porous layer may be electrochemically etched, plasma etched and/or wet etched to remove the oxidized residual porous layer and/or the one or more portions of oxidized SiC.

In some examples, etching of the oxidized residual porous layer may form a second residual porous layer. The second residual porous layer may be removed via grinding the second residual porous layer and/or etching the second residual porous layer. Alternatively and/or additionally, actions comprising oxidizing SiC, etching oxidized SiC, grinding residual SiC and/or etching residual SiC may be performed and/or repeated until the second residual porous layer and/or oxidized SiC (and/or SiC of the porous layer 120) are removed from the SiC layer.

In a fifth embodiment, the porous layer 120 may be removed via grinding the porous layer 120. For example, the porous layer 120 may be grinded using a grinding wheel (e.g., a fine grinding wheel and/or a coarse grinding wheel). It may be appreciated that grinding the porous layer 120 may be faster and/or less expensive compared with grinding the first portion 106 of the SiC layer (prior to converting the first portion 106 of the SiC layer to the porous layer 120). Alternatively and/or additionally, grinding the porous layer 120 using the grinding wheel may result in less (material) consumption of the grinding wheel than grinding the first portion 106 of the SiC layer using the grinding wheel (prior to converting the first portion 106 of the SiC layer to the porous layer 120).

In a sixth embodiment, the porous layer 120 may be removed via performing a damage implant to the porous layer 120 to form an implanted porous layer. The damage implant to the porous layer 120 may be performed and/or the implanted porous layer may be formed via applying an implantation process to the porous layer 120 using aluminum (Al), argon (Ar), arsenic (As) and/or a different material. In some examples, the implanted porous layer (and/or the porous layer 120) may be removed via etching the implanted porous layer (and/or etching the porous layer 120) after the implanted porous layer is formed. The implanted porous layer (and/or the porous layer 120) may be electrochemically etched, plasma etched and/or wet etched to remove the implanted porous layer (and/or the porous layer 120). For example, the implanted porous layer may be wet etched using one or more etching chemicals (e.g., additives in an electrochemical solution), such as HF, nitric acid ($HNO_3$), tetramethylammonium hydroxide (TMAH), and/or KOH.

It may be appreciated that wet etching the implanted porous layer may be faster and/or less expensive compared with wet etching the first portion 106 of the SiC layer (prior to converting the first portion 106 of the SiC layer to the porous layer 120) and/or wet etching the porous layer 120 (prior to performing the damage implant to the porous layer 120 to form the implanted porous layer). Alternatively and/or additionally, wet etching the implanted porous layer may be performed at a higher etch rate than wet etching the first portion 106 of the SiC layer (prior to converting the first portion 106 of the SiC layer to the porous layer 120) and/or wet etching the porous layer 120 (prior to performing the damage implant to the porous layer 120 to form the implanted porous layer).

Figure 6A:
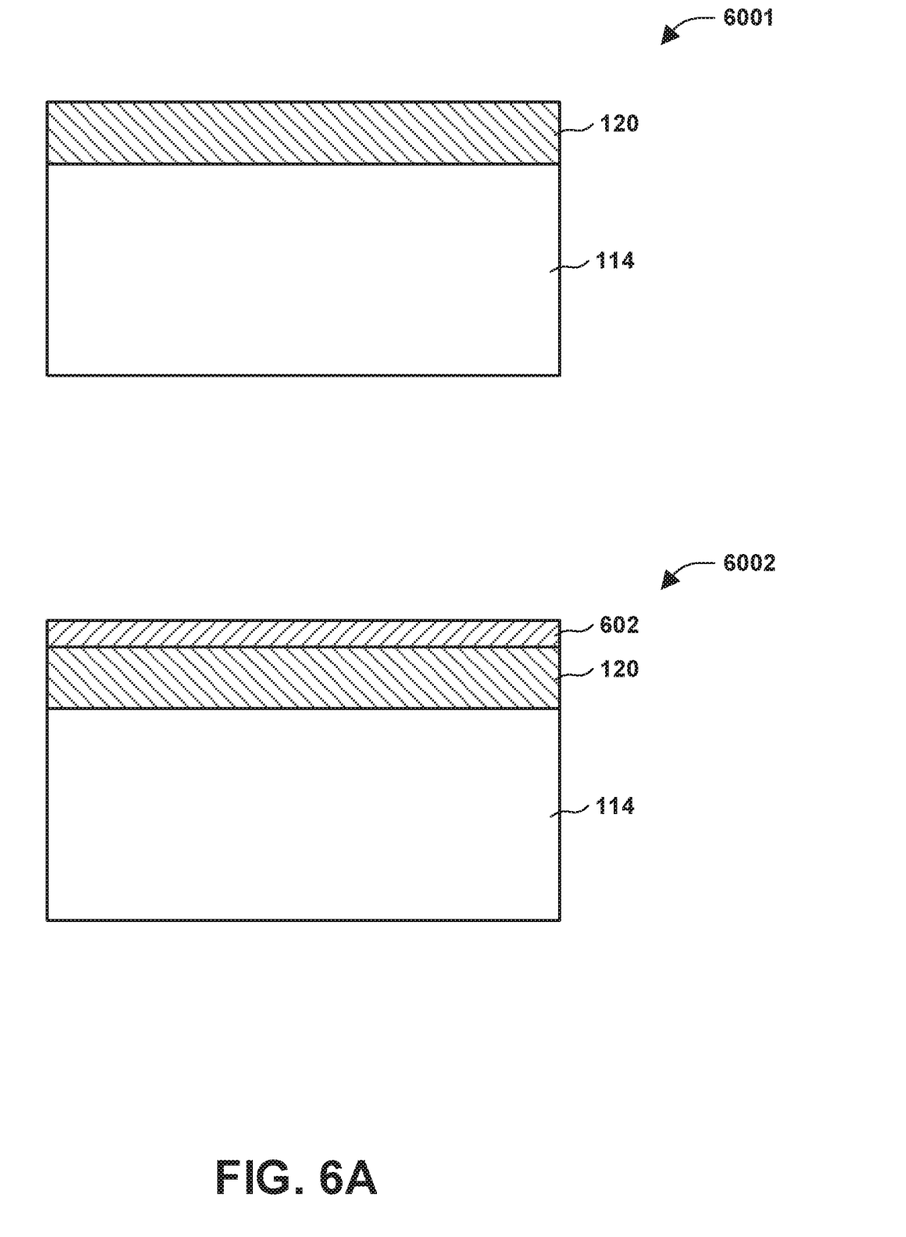
FIG. 6A schematically illustrates actions of removing a porous layer according to a seventh embodiment.
Figure 6B:
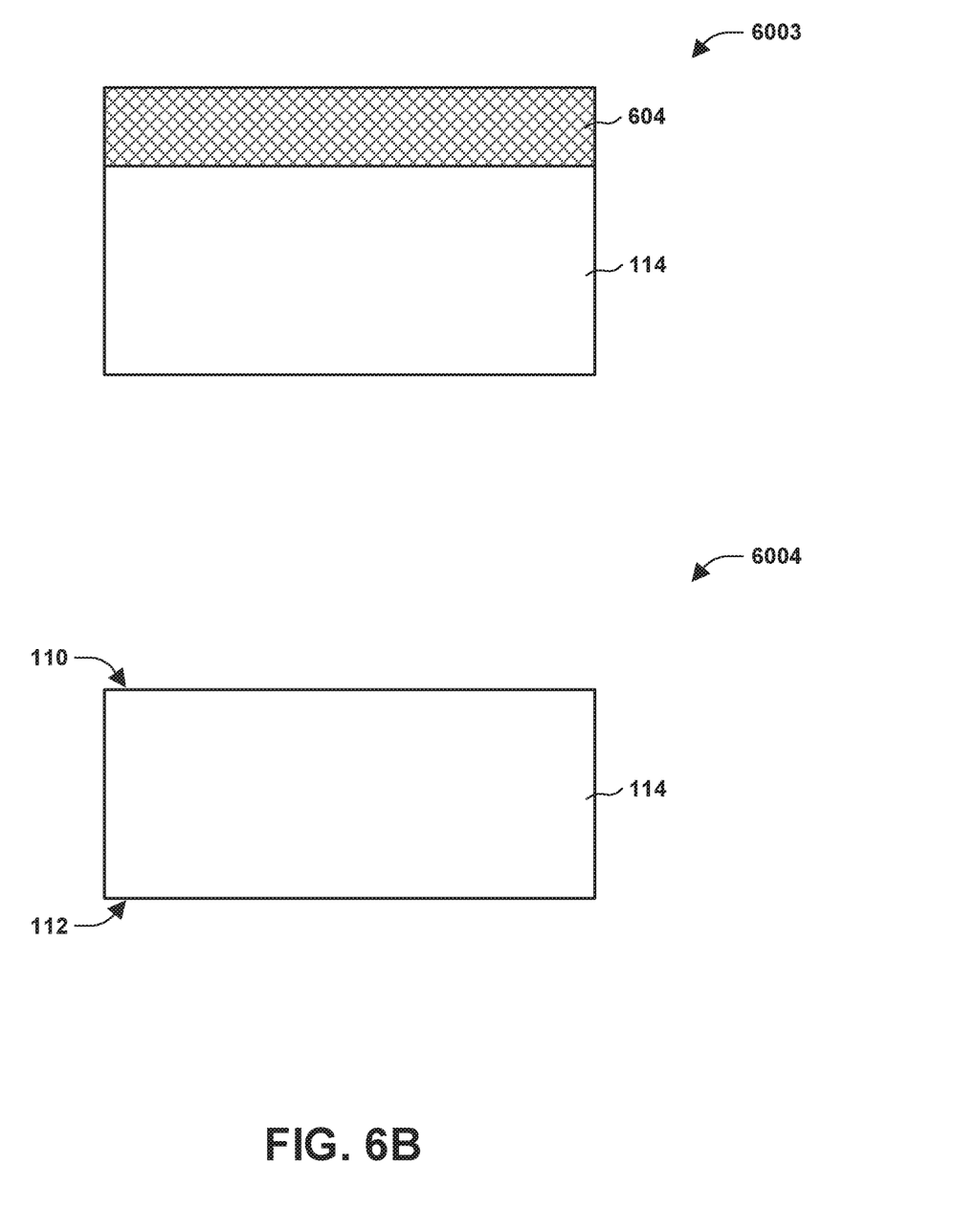
FIG. 6B schematically illustrates actions of removing a porous layer according to a seventh embodiment.

In a seventh embodiment, the porous layer 120 may be removed via deposition of metal over the porous layer 120. FIGS. 6A-6B illustrate aspects with respect to removing the porous layer 120 in accordance with the seventh embodiment. 6001 of FIG. 6A corresponds to 1002 of FIG. 1.

At 6002 of FIG. 6A, a metal layer 602 is deposited over the porous layer 120. The metal layer 602 may be made of one or more metals, such as titanium (Ti), Nickel (Ni) and/or Molybdenum (Mo). The metal layer 602 may overly the porous layer 120. Alternatively and/or additionally, the metal layer 602 may be vertically coincident with the porous layer 120. In some examples, a surface of the metal layer 602 may be adjacent to the first side 116 of the porous layer 120. The metal layer 602 may (completely) cover the first side 116 of the porous layer 120. Alternatively and/or additionally, the metal layer 602 may cover voids (e.g., gas-filled voids), pores, and/or ramifications within the porous layer 120. Alternatively and/or additionally, one or more regions (and/or one or more portions) of the porous layer 120 at the first side 116 of the porous layer 120 may not be covered by the metal layer 602. The metal layer 602 may have direct contact with the first side 116 of the porous layer 120. Alternatively and/or additionally, the metal layer 602 may not have direct contact with the first side 116 of the porous layer 120. A thickness of the metal layer 602 (along the vertical direction) may be in the range of at least 1 nm to at most 200 nm and/or in the range of at least 10 nm to at most 100 nm.

At 6003 of FIG. 6B, the metal layer 602 and/or the porous layer 120 may be thermally treated to form a metal silicide and/or carbon (C). In an example where the metal layer 602 comprises Ti, the metal layer 602 and/or the porous layer 120 may be thermally treated to form titanium silicide and/or titanium disilicide. In an example where the metal layer 602 comprises Ni, the metal layer 602 and/or the porous layer 120 may be thermally treated to form nickel silicide. Alternatively and/or additionally, a metal silicide layer 604 may be formed by thermally treating the metal layer 602 and/or the porous layer 120. The metal silicide layer 604 may comprise the metal silicide and/or C. The metal layer 602 and/or the porous layer 120 may be thermally treated to form the metal silicide and/or C (and/or the metal silicide layer 604) by heating the metal layer 602 and/or the porous layer 120 at a thermal treatment temperature. In some examples, the thermal treatment temperature may be in the range of at least 800° C. to at most 1500° C. and/or in the range of at least 1000° C. to at most 1400° C. In some examples, at least a portion of the porous layer 120 and/or at least a portion of the metal layer 602 may be converted into the metal silicide layer 604 via thermally treating the metal layer 602 and/or the porous layer 120.

At 6004 of FIG. 6B, the metal silicide and/or the metal silicide layer 604 (comprising the metal silicide and/or C) may be removed. In some examples, the metal silicide and/or the metal silicide layer 604 may be removed via etching the metal silicide and/or the metal silicide layer 604 after the metal silicide and/or the metal silicide layer 604 are formed. The metal silicide and/or the metal silicide layer 604 may be electrochemically etched, plasma etched and/or wet etched to remove the metal silicide and/or the metal silicide layer 604. It may be appreciated that etching the metal silicide and/or the metal silicide layer 604 may be faster and/or less expensive compared with etching the first portion 106 of the SiC layer (prior to converting the first portion 106 of the SiC layer to the porous layer 120) and/or etching the porous layer 120 (prior to forming the metal silicide). Alternatively and/or additionally, etching the metal silicide and/or the metal silicide layer 604 may be performed at a higher etch rate than etching the first portion 106 of the SiC layer (prior to converting the first portion 106 of the SiC layer to the porous layer 120) and/or etching the porous layer 120 (prior to forming the metal silicide).

In an eighth embodiment, the porous layer 120 may be removed via etching the porous layer 120 using KOH and/or NaOH (and/or a different material) as an etchant. For example, KOH and/or NaOH may be heated at a melting temperature to form a melted KOH and/or a melted NaOH, respectively. In some examples, the melting temperature may be in the range of at least 300° C. to at most 1200° C. and/or in the range of at least 360° C. to at most 500° C. The porous layer 120 may be etched using the melted KOH and/or the melted NaOH to remove the porous layer 120. It may be appreciated that etching the porous layer 120 using melted KOH and/or melted NaOH may be faster and/or less expensive compared with etching the first portion 106 of the SiC layer using the melted KOH and/or the melted NaOH (prior to converting the first portion 106 of the SiC layer to the porous layer 120). Alternatively and/or additionally, etching the porous layer 120 using the melted KOH and/or the melted NaOH may be performed at a higher etch rate than etching the first portion 106 of the SiC layer using the melted KOH and/or the melted NaOH (prior to converting the first portion 106 of the SiC layer to the porous layer 120).

It may be appreciated that techniques described with respect to each of the first embodiment, the second embodiment, the third embodiment, the fourth embodiment, the fifth embodiment, the sixth embodiment, the seventh embodiment and the eighth embodiment may be performed independently and/or separately to remove the porous layer 120 (from the SiC layer). Alternatively and/or additionally, a combination of techniques described with respect to the first embodiment, the second embodiment, the third embodiment, the fourth embodiment, the fifth embodiment, the sixth embodiment, the seventh embodiment and/or the eighth embodiment may be performed to remove the porous layer 120 (from the SiC layer).

In some examples, after removing the porous layer 120, polishing (e.g., CMP) and/or etching may be applied to the second portion 114 of the SiC layer (and/or the first side 110 of the second portion 114) to increase a surface quality of the second portion 114 of the SiC layer and/or a subsurface quality of the second portion 114 of the SiC layer.

An embodiment may be contemplated where a SiC layer is provided. A metal layer may be deposited over the SiC layer. The metal layer and/or the SiC layer may be thermally treated to form a metal silicide. The metal silicide may be etched to expose a surface of the SiC layer. After etching the metal silicide, the surface of the SiC layer may have a surface roughness less than a surface roughness of the SiC layer prior to depositing the metal layer over the SiC layer and/or a source roughness of the metal layer.

FIG. 7 illustrates aspects with respect to splitting a SiC wafer according to various examples of the present disclosure. At 7001, a SiC wafer 702 is provided. For example, the SiC wafer 702 may comprise SiC. Alternatively and/or additionally, the SiC wafer 702 may comprise impurities and/or dopants within levels associated with fabrication tolerances. Alternatively and/or additionally, the SiC wafer 702 may comprise SiC in crystalline form. The SiC wafer 702 may comprise a single SiC polytype (e.g., one of 4H-SiC polytype, 2H-SiC and/or 6H-SiC). Alternatively and/or additionally, the SiC wafer 702 may comprise multiple SiC polytypes. In some examples, the SiC wafer 702 may consist of a single piece of SiC in crystalline form. Alternatively and/or additionally, the SiC wafer 702 may consist of multiple pieces of SiC in crystalline form. The SiC wafer 702 may have a first side 710 opposite a second side 712 of the SiC wafer 702. One or more semiconductor devices 704 may be disposed at the first side 710 of the SiC wafer 702.

At 7002, the SiC wafer 702 may be split into multiple separate layers comprising a first SiC layer 706 and/or a second SiC layer 708. In an example, a laser may be applied to one or more portions of the SiC wafer 702 to cause damage to the SiC wafer 702. For example, the laser may be applied to the SiC wafer 702 to form a damaged layer. Alternatively and/or additionally, a splitting process may be applied to the SiC wafer 702 to split the SiC wafer 702 along the damaged layer of the SiC wafer 702. The cold splitting process may comprise depositing a polymer over a surface of the SiC wafer 702 and/or cooling the SiC wafer 702 and/or the polymer. When cooling the SiC wafer 702 and/or the polymer, a length and/or volume change of the polymer induces a mechanical stress which leads to a fracture of the SiC wafer 702. Alternatively and/or additionally, one or more other splitting processes may be applied to the SiC wafer 702 to cause the SiC wafer 702 to split into the multiple separate layers.

In some examples, the first SiC layer 706 may have a first side 714 opposite a second side 716 of the first SiC layer 706. The first side 714 of the first SiC layer 706 may be the same as the first side 710 of the SiC wafer 702. The second side 716 of the first SiC layer 706 may correspond to a portion of the damaged layer of the SiC wafer 702 where the SiC wafer 702 is fractured and/or is split into the first SiC layer 706 and/or the second SiC layer 708. The second side 716 of the first SiC layer 706 may have a sixth surface roughness. The sixth surface roughness may be greater than the threshold surface roughness for performing one or more processes to the first SiC layer 706, such as metallization and/or deposition of an epitaxial layer onto the first SiC layer 706 (and/or onto the second side 716 of first SiC layer 706). In some examples, the sixth surface roughness of the second side 716 of the first SiC layer 706 may be greater than the threshold surface roughness as a result of splitting the SiC wafer 702. Alternatively and/or additionally, the sixth surface roughness of the second side 716 of the first SiC layer 706 may be greater than the threshold surface roughness as a result of applying the cold splitting process to the SiC wafer 702 to split the SiC wafer 702 along the damaged layer of the SiC wafer 702.

In some examples, the second side 716 of the first SiC layer 706 may correspond to the first side 102 of the first portion 106 of the SiC layer presented in FIG. 1. For example, one or more techniques presented herein (e.g., converting a portion of the first SiC layer 706 into a porous layer, removing the porous layer, etc.) may be applied to the second side 716 of the first SiC layer 706 to smooth a surface of the first SiC layer 706 corresponding to the second side 716 of the first SiC layer 706 (and/or one or more techniques presented herein may be applied to the first portion 106 of the SiC layer presented in FIG. 1 to smooth a surface corresponding to the first side 102 of the first portion 106 of the SiC layer).

It may be appreciated that applying one or more of the techniques presented herein for surface smoothing in semiconductor manufacturing and/or for reducing a thickness of a semiconductor layer made of SiC (e.g., a 4H-SiC polytype, a 6H-SiC polytype and/or a different SiC polytype), and/or a different material (e.g., a wide band-gap semiconductor material) having a high hardness and/or a high toughness, may lead to benefits.

The benefits include, but are not limited to, a reduced amount of energy consumption for smoothing a surface of the semiconductor layer and/or for reducing the thickness for the semiconductor layer. The benefits include a reduced amount of material consumption for smoothing the surface of the semiconductor layer and/or for reducing the thickness for the semiconductor layer. The benefits include a reduced amount of (material) consumption of a grinding wheel used to grind the semiconductor layer. The benefits include a higher speed at which the surface of the semiconductor layer is smoothed and/or the thickness of the semiconductor layer is reduced. The benefits include a higher quality of the semiconductor layer as a result of less crystal damage introduced to the semiconductor layer. The benefits include a higher quality of the semiconductor layer as a result of removing crystal damage of the semiconductor layer. The benefits include a higher structural stability of the semiconductor layer and/or a reduced wafer bow of the semiconductor layer as a result of porosifying a portion of the semiconductor layer to remove stress introduced to the semiconductor layer (via grinding, for example).

The benefits may be achieved as a result of performing one or more of the techniques presented herein, such as converting a portion of the semiconductor layer into a porous layer and/or removing the porous layer via one or more of electrochemically etching the porous layer, plasma etching the porous layer, oxidizing the porous layer to form an oxidized porous layer, etching the oxidized porous layer, grinding the porous layer, performing a damage implant to the porous layer to form an implanted porous layer, etching the implanted porous layer, depositing a metal layer over the porous layer, thermally treating the metal layer and/or the porous layer to form a metal silicide, etching the metal silicide, etching the porous layer using KOH and/or NaOH, etc.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of surface smoothing in semiconductor manufacturing, comprising:
   providing a silicon carbide (SiC) layer having a first portion overlying a second portion, wherein
      the first portion has a first side distal the second portion and a second side proximal the second portion,
      the second portion has a first side proximal the first portion and a second side distal the first portion, and
      the second portion has a first porosity;
   converting the first portion of the SiC layer, but not the second portion of the SiC layer, into a porous layer comprising SiC and overlying the second portion of the SiC layer, wherein
      the porous layer has a first side distal the second portion and a second side proximal the second portion,
      the first side of the second portion is proximal the porous layer and the second side of the second portion is distal the porous layer, and
      the porous layer overlying the second portion has a second porosity, and the second porosity of the porous layer comprising SiC is greater than the first porosity of the second portion comprising SiC upon the conversion of the first portion, but not the second portion, into the porous layer; and
   removing the porous layer to expose the first side of the second portion, wherein after removing the porous layer the first side of the second portion has a surface roughness less than at least one of a surface roughness of the first side of the first portion or a surface roughness of the first side of the porous layer.

2. The method of claim 1, wherein converting the first portion of the SiC layer comprises:
   electrochemically porosifying the first portion of the SiC layer.

3. The method of claim 1, wherein
   before converting the first portion, a semiconductor device is disposed at the second side of the second portion, and
   after removing the porous layer, the semiconductor device is disposed at the second side of the second portion.

4. The method of claim 1, wherein removing the porous layer comprises:
   electrochemically etching the porous layer.

5. The method of claim 1, wherein removing the porous layer comprises:
   plasma etching the porous layer.

6. The method of claim 1, wherein removing the porous layer comprises:
   oxidizing the porous layer to form an oxidized porous layer.

7. The method of claim 6, wherein removing the porous layer comprises:
   etching the oxidized porous layer.

8. The method of claim 7, wherein etching the oxidized porous layer forms a residual porous layer, and removing the porous layer comprises:
   oxidizing the residual porous layer to form an oxidized residual porous layer.

9. The method of claim 8, wherein removing the porous layer comprises:
   etching the oxidized residual porous layer.

10. The method of claim 1, wherein removing the porous layer comprises:
    grinding the porous layer.

11. The method of claim 1, wherein removing the porous layer comprises:
    performing a damage implant to the porous layer to form an implanted porous layer.

12. The method of claim 11, wherein removing the porous layer comprises:
    etching the implanted porous layer.

13. The method of claim 1, wherein removing the porous layer comprises:
    depositing a metal layer over the porous layer.

14. The method of claim 13, wherein removing the porous layer comprises:
    thermally treating at least one of the metal layer or the porous layer to form a metal silicide.

15. The method of claim 14, wherein removing the porous layer comprises:
    etching the metal silicide.

16. The method of claim 1, wherein removing the porous layer comprises:
    etching the porous layer using potassium hydroxide (KOH) or sodium hydroxide (NaOH).

17. A method of surface smoothing in semiconductor manufacturing, comprising:
    providing a silicon carbide (SiC) layer having a first portion overlying a second portion, wherein
       the first portion has a first side distal the second portion and a second side proximal the second portion, and
       the second portion has a first side proximal the first portion and a second side distal the first portion;
    converting the first portion of the SiC layer into a porous layer comprising SiC and overlying the second portion of the SiC layer, wherein
       the porous layer has a first side distal the second portion and a second side proximal the second portion, and
       the first side of the second portion is proximal the porous layer and the second side of the second portion is distal the porous layer; and removing the porous layer comprising SiC to expose the first side of the second portion comprising SiC, wherein before converting the first portion, a semiconductor device is disposed at the second side of the second portion, and after removing the porous layer, the semiconductor device is disposed at the second side of the second portion.

18. A method of surface smoothing in semiconductor manufacturing, comprising:

providing a silicon carbide (SiC) layer having a first portion overlying a second portion, wherein
the first portion has a first side distal the second portion and a second side proximal the second portion, and
the second portion has a first side proximal the first portion and a second side distal the first portion;

converting the first portion of the SiC layer into a porous layer overlying the second portion of the SiC layer, wherein
the porous layer has a first side distal the second portion and a second side proximal the second portion, and
the first side of the second portion is proximal the porous layer and the second side of the second portion is distal the porous layer; and removing the porous layer to expose the first side of the second portion, wherein
after removing the porous layer the first side of the second portion has a surface roughness less than at least one of a surface roughness of the first side of the first portion or a surface roughness of the first side of the porous layer, and
a semiconductor device is disposed at the second side of the second portion.

* * * * *